(12) United States Patent
Rhee et al.

(10) Patent No.: US 7,268,630 B2
(45) Date of Patent: Sep. 11, 2007

(54) PHASE-LOCKED LOOP USING CONTINUOUSLY AUTO-TUNED INDUCTOR-CAPACITOR VOLTAGE CONTROLLED OSCILLATOR

(75) Inventors: Woogeun Rhee, Norwood, NJ (US); Herschel A. Ainspan, New Hempstead, NY (US); Daniel Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 11/113,856

(22) Filed: Apr. 25, 2005

(65) Prior Publication Data

US 2006/0238261 A1  Oct. 26, 2006

(51) Int. Cl.
*H03L 7/00* (2006.01)
(52) U.S. Cl. .................. 331/16; 331/36 C; 331/117 R; 331/167; 331/177 V
(58) Field of Classification Search ............ 331/117 R, 331/177 V, 36 C, 167, 16
See application file for complete search history.

(56) References Cited

U.S. PATENT DOCUMENTS

| | | | | |
|---|---|---|---|---|
| 5,486,796 | A * | 1/1996 | Ishikawa et al. | 331/117 R |
| 6,529,072 | B2 * | 3/2003 | Takada | 330/149 |
| 6,882,237 | B2 * | 4/2005 | Singh et al. | 331/185 |
| 6,933,789 | B2 * | 8/2005 | Molnar et al. | 331/2 |
| 6,946,924 | B2 * | 9/2005 | Chominski | 331/177 V |
| 7,049,852 | B2 * | 5/2006 | Melanson | 327/5 |

OTHER PUBLICATIONS

T.-H. Lin et al., "A 900-MHz 2.5-mA CMOS Frequency Synthesizer with an Automatic SC Tuning Loop," IEEE Journal of Solid-State Circuits, vol. 36, No. 3, pp. 424-431, Mar. 2001.
W. Wilson et al., "A CMOS Self-Calibrating Frequency Synthesizer," IEEE Journal of Solid-State Circuits, vol. 35, No. 10, pp. 1437-1444, Oct. 2000.
H. Noguchi et al., "A 9.9G-10.8Gb/s Rate-Adaptive Clock and Data Recovery with No External Reference Clock for WDM Optical Fiber Transmission," ISSCC, Session 15, Gigabit Communications, 15.3, 10 pages, Feb. 2002.
Y. Moon et al., "A Quad 0.6-3.2Gb/s/Channel Interference-Free CMOS Transceiver Backplane Serial Link," IEEE Journal of Solid-State Circuits, vol. 39, No. 5, pp. 795-803, May 2004.
J. Kim et al., "A 44GHz Differentially Tuned VCO with 4GHz Tuning Range in 0.12um SOI CMOS," ISSCC, Session 22, PLL, DLL, and VCOs, 22.4, pp. 416-417, and 608, Feb. 2005.

* cited by examiner

Primary Examiner—Robert Pascal
Assistant Examiner—Levi Gannon
(74) Attorney, Agent, or Firm—Anne V. Dougherty; Ryan, Mason & Lewis, LLP

(57) ABSTRACT

Improved voltage controlled oscillator circuits and phase-locked loop circuits are disclosed. For example, a voltage controlled oscillator circuit comprises a first linear amplifier, the first linear amplifier generating a coarse-tuning voltage from an input voltage, a second linear amplifier, the second linear amplifier generating a fine-tuning voltage from the input voltage, and a voltage controlled oscillator comprising a coarse-tuning input coupled to the first linear amplifier, a fine-tuning input coupled to the second linear amplifier, and a clock signal output, wherein a frequency of a signal on the clock signal output is changeable as a function of the input voltage. Such a voltage controlled oscillator circuit may be employed in a phase-locked loop circuit.

7 Claims, 4 Drawing Sheets

PHASE-LOCKED LOOP USING CONTINUOUSLY AUTO-TUNED INDUCTOR-CAPACITOR VOLTAGE CONTROLLED OSCILLATOR

FIELD OF THE INVENTION

This present invention generally relates to phase-locked loop circuits and, more particularly, to phase-locked loop circuits using continuously auto-tuned inductor-capacitor voltage controlled oscillators.

BACKGROUND OF THE INVENTION

Phase-locked loop circuits are used in both wireless and wireline communication systems, as well as other applications and environments. A phase-locked loop (PLL) based on inductor-capacitor voltage controlled oscillator (LC-VCO) is one way to meet stringent jitter requirements since ring oscillators have inferior noise performance as compared to LC oscillators.

The use of an LC-VCO in application-specific integrated circuits (ASICs), however, is not as widespread as in wireless applications. One of the major reasons is the narrow tuning range of such oscillators, which makes it difficult to achieve a specified PLL lock-in range over process, voltage, and temperature variations in an ASIC environment. Meeting a target frequency range and oscillation conditions in LC-VCO design also heavily relies on accurate model-to-hardware correlation of passive elements, i.e., inductors and varactors.

One way to overcome the tradeoff between low noise and tuning range is to have a multi-band VCO with self-calibration, see, e.g., T.-H. Lin et al., "900-MHz 2.5-mA CMOS Frequency Synthesizer with an Automatic SC Tuning Loop," IEEE Journal of Solid-State Circuits, vol. 36, pp. 424-431, March 2001, and W. Wilson et al., "CMOS Self-calibrating Frequency Synthesizer," IEEE Journal of Solid-State Circuits, vol. 35, pp. 1436-1444, October 2000, the disclosures of which are incorporated by reference herein.

For LC-VCOs, a digitally programmable varactor array 12 is usually employed as shown in FIG. 1. By having multiple coarse-tuning varactors with sufficient frequency overlap, a relatively wide tuning range can be achieved without degrading phase noise performance. One problem of using a band-switching LC-VCO is the possibility of having large gain variation over temperature. Even though center frequency shift over process variation can be calibrated during system initialization (via calibration logic 14), center frequency drift over temperature needs to be accommodated by the PLL without switching bands. Otherwise, the system clock will have an abrupt frequency change during normal operation.

As illustrated in FIG. 2, discrete coarse-tuning curves still require careful VCO design for each band. Large VCO gain variation is harmful for PLL performance unless additional complicated compensation circuits are implemented for VCO gain linearization.

SUMMARY OF THE INVENTION

The present invention provides improved voltage controlled oscillator circuits and phase-locked loop circuits.

For example, in one aspect of the invention, a voltage controlled oscillator circuit comprises a first linear amplifier, the first linear amplifier generating a coarse-tuning voltage from an input voltage, a second linear amplifier, the second linear amplifier generating a fine-tuning voltage from the input voltage, and a voltage controlled oscillator comprising a coarse-tuning input coupled to the first linear amplifier, a fine-tuning input coupled to the second linear amplifier, and a clock signal output, wherein a frequency of a signal on the clock signal output is changeable as a function of the input voltage.

The voltage controlled oscillator may further comprise a coarse-tuning varactor coupled to the coarse-tuning input, and a fine-tuning varactor coupled to the fine-tuning input. The voltage controlled oscillator may still further comprise an inductor parallel with the varactors, and transistors coupled to the varactors and the inductor. The first linear amplifier may comprise a lowpass filter. The lowpass filter in the first linear amplifier may comprise at least one capacitor and at least one resistor. The first linear amplifier may comprise a higher gain than the second linear amplifier.

In one embodiment, the voltage controlled oscillator may comprise a differential-input voltage controlled oscillator comprising a differential coarse-tuning varactor and a differential fine-tuning varactor, the first linear amplifier may comprise a differential output, and the second linear amplifier may comprise a differential output.

In another aspect of the invention, a phase-locked loop circuit comprising a dual-input voltage controlled oscillator having a coarse tuning input, a fine tuning input, and a clock signal output, wherein signals on the clock signal output have a changing frequency controlled by input signals, a frequency divider coupled to receive the output of the voltage controlled oscillator and responsive to the output of the voltage controlled oscillator to provide a frequency divided output signal, a phase and frequency detector that compares a reference clock with an output clock of the frequency divider and generates a charge pump control voltage, a charge pump coupled to the phase and frequency detector that generates a loop filter control current from the charge pump control voltage, a loop filter coupled to the charge pump that generates a loop filter voltage from the loop filter control current. The phase-locked loop circuit also comprises a coarse-tuning linear amplifier coupled to the loop filter that generates a voltage controlled oscillator coarse-tuning voltage from the loop filter voltage, and a fine-tuning linear amplifier coupled to the loop filter that generates a voltage controlled oscillator fine-tuning voltage from the loop filter voltage. The phase-locked loop circuit may also comprise a digitally programmable charge pump current, and a charge pump current, the variation of which is inversely proportional to a resistor variation in the loop filter.

In a further aspect of the invention, a voltage controlled oscillator circuit comprises a coarse-tuning linear amplifier, the linear amplifier generating a coarse-tuning voltage from an input voltage; and a voltage controlled oscillator coupled to the coarse-tuning linear amplifier, wherein the voltage controlled oscillator comprises a single coarse-tuning varactor responsive to the coarse-tuning voltage such that a digitally programmable varactor array is not required to provide coarse-tuning of the voltage controlled oscillator circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustratively explained, principles of the invention provide techniques for reducing bandwidth variation in phase-locked loop (PLL) designs by enabling a continuously automatically tuned (auto-tuned) PLL which eliminates a digital logic macro (e.g., calibration logic 14 in FIG. 1) for coarse frequency calibration. An inductor-capacitor voltage controlled oscillator (LC-VCO), in accordance with principles of the invention, employs a single coarse-tuning varactor controlled by an analog control voltage. This is in contrast to the LC-VCO of FIG. 1 which requires a digitally programmable varactor array.

A PLL, in accordance with the invention, has a high open-loop gain for the coarse-tuning path. Hence, the input voltage range for a fine-tuning varactor can be minimized over entire bands, resulting in enhanced VCO gain linearity. High open-loop gain of the coarse-tuning loop also minimizes the static phase offset of the PLL. Dual-input VCOs have been employed in wireline communication systems, see, e.g., "H. Noguchi et al., "9.9 G-10.8 Gb/s Rate-adaptive Clock and Data Recovery with No External Reference Clock for WDM Optical Fiber Transmission," ISSCC, pp. 252-253, February 2002, and Y. Moon et al., "Quad 0.6-3.2 Gb/s/channel Interference-free CMOS Transceiver Backplane Serial Link, IEEE Journal of Solid-State Circuits, vol. 39, pp. 795-803, May 2004, the disclosures of which are incorporated by reference herein. In accordance with principles of the invention, both inputs of linear amplifiers are controlled by the same control voltage. Hence, in accordance with this illustrative embodiment, the VCO is considered a single-input dual-path VCO. The single-input dual-path LC-VCO offers seamless tuning range with linear gain, while achieving superior noise performance compared to a ring VCO.

Figure 3:
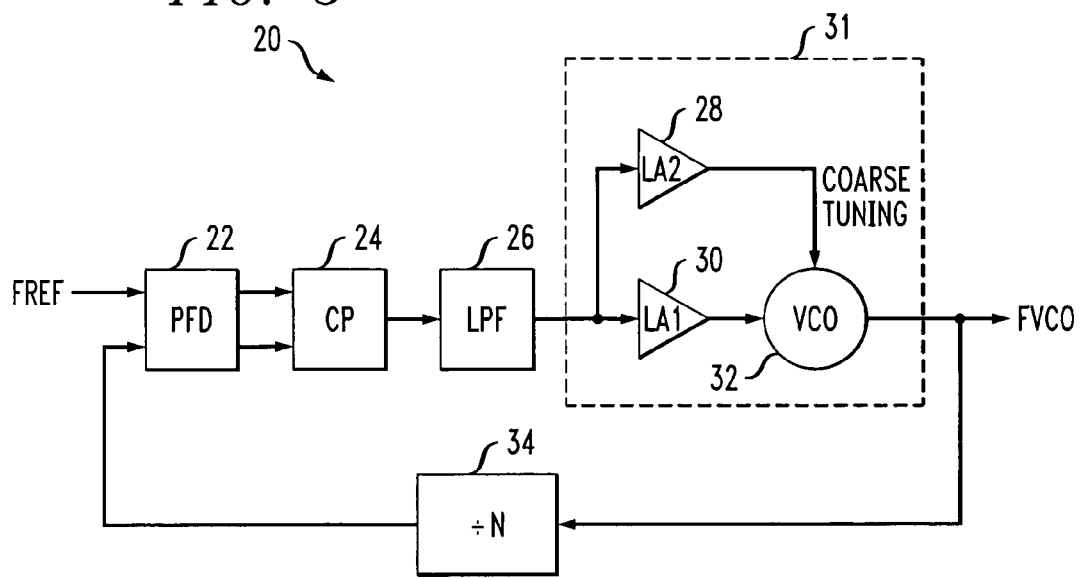
FIG. 3 is a diagram illustrating a phase-locked loop using a continuously auto-tuned LC-VCO in accordance with an illustrative embodiment of the invention.

FIG. 3 is a block diagram of the PLL with a continuously auto-tuned LC-VCO 32 which represents an embodiment of the present invention. The PLL is generally indicated as 20. The PLL 20 can be implemented as an integrated circuit using known complementary metal oxide semiconductor (CMOS) fabrication methods or other compatible semiconductor chip technology.

As shown, a reference frequency (FREF) is provided to an input of a phase and frequency detector 22. The reference frequency can be provided, for example, by an oscillator such as a crystal oscillator. The phase and frequency detector (PFD) 22 compares a reference clock with an output clock of frequency divider and generates an appropriate charge pump control voltage. The charge pump (CP) 24 generates a loop filter control current from the charge pump control voltage and a loop filter (LPF) 26 coupled to the charge pump generates a loop filter voltage from the loop filter control current. The linear amplifiers 28, 30 convert the differential loop filter output to a single-ended voltage to control the VCO 32, which has an output (FVCO) which is the output of the PLL 20. The output of the VCO 32 is supplied to the frequency divider 34.

The LC-VCO 32 employs a single coarse-tuning varactor controlled by an analog control voltage instead of having a digitally programmable varactor array. The linear amplifier (LA2) 28 in the coarse-tuning path is designed to have higher gain than the linear amplifier (LA1) 30 in the fine-tuning path. In that way, the input voltage range can be minimized over entire bands, resulting in enhanced VCO gain linearity. Reduced voltage range in the loop filter 26 also relaxes the charge pump 24 design since it minimizes current mismatch among current mirrors caused by the channel length modulation effect. Hence, the high open-loop gain of the coarse-tuning loop also minimizes the static phase offset of the PLL. In accordance with principles of the invention, both inputs of the linear amplifiers 28, 30 are controlled by the same control voltage. Hence, the VCO 32 with linear amplifiers 28, 30 may be considered a single-input dual-path VCO (as denoted as reference numeral 31 in FIG. 3).

Some advantages that principles of the invention have over conventional PLLs with band-switching LC-VCOs are as follows.

Figure 1:
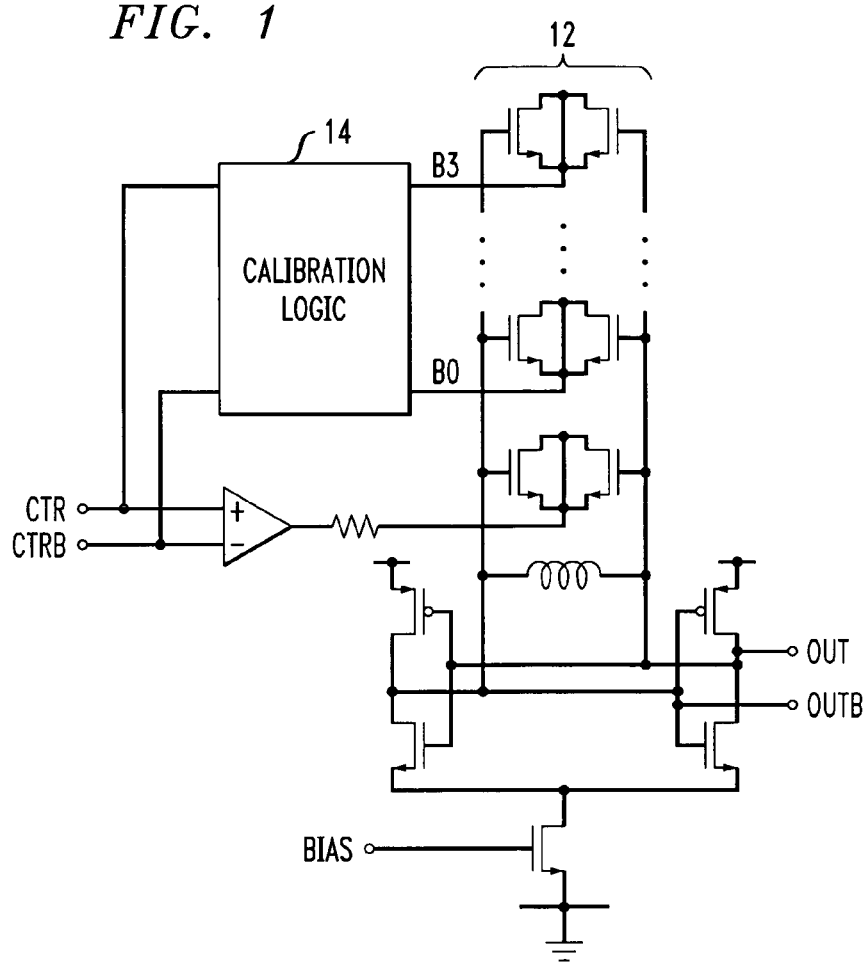
FIG. 1 is a diagram illustrating a band-switching LC-VCO.
Figure 2:
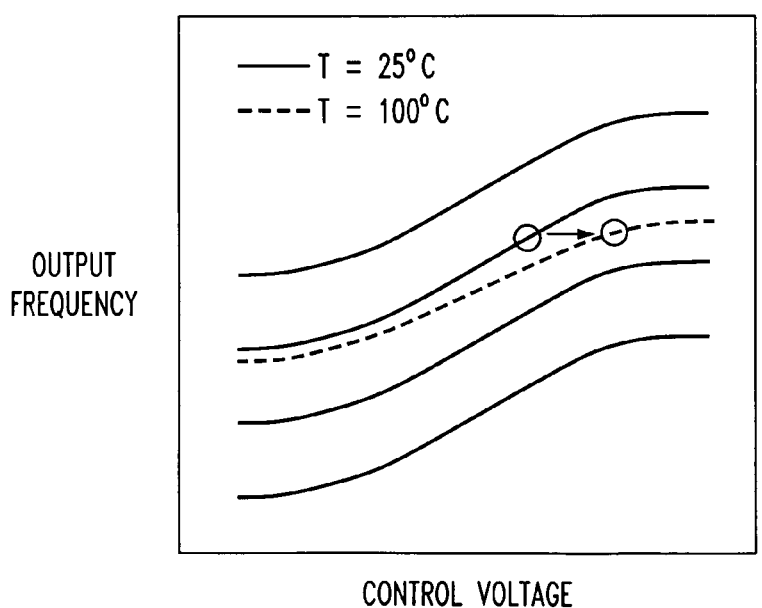
FIG. 2 is a diagram illustrating an exemplary tuning curve of a band-switching LC-VCO with different temperatures.

First, principles of the invention serve to eliminate the digital logic macro 14 shown in FIG. 1 which is needed for coarse-tuning calibration.

Second, the reduced control voltage range for the fine-tuning varactor provides linear VCO gain as well as minimum VCO gain variation over wide tuning range. Hence, principles of the invention provide a method of obtaining substantially constant bandwidth in a PLL.

Third, reduced voltage range in the loop filter 26 enhances static phase offset performance of the PLL by easing charge pump design.

Fourth, the coarse-tuning path enhances the PLL settling time since the coarse-tuning path enhances frequency acquisition.

Finally, having seamless tuning range, the PLL can accommodate a reference clock modulated by spread spectrum with large frequency deviation, which is needed in some applications to reduce electromagnetic interference (EMI).

Figure 4:
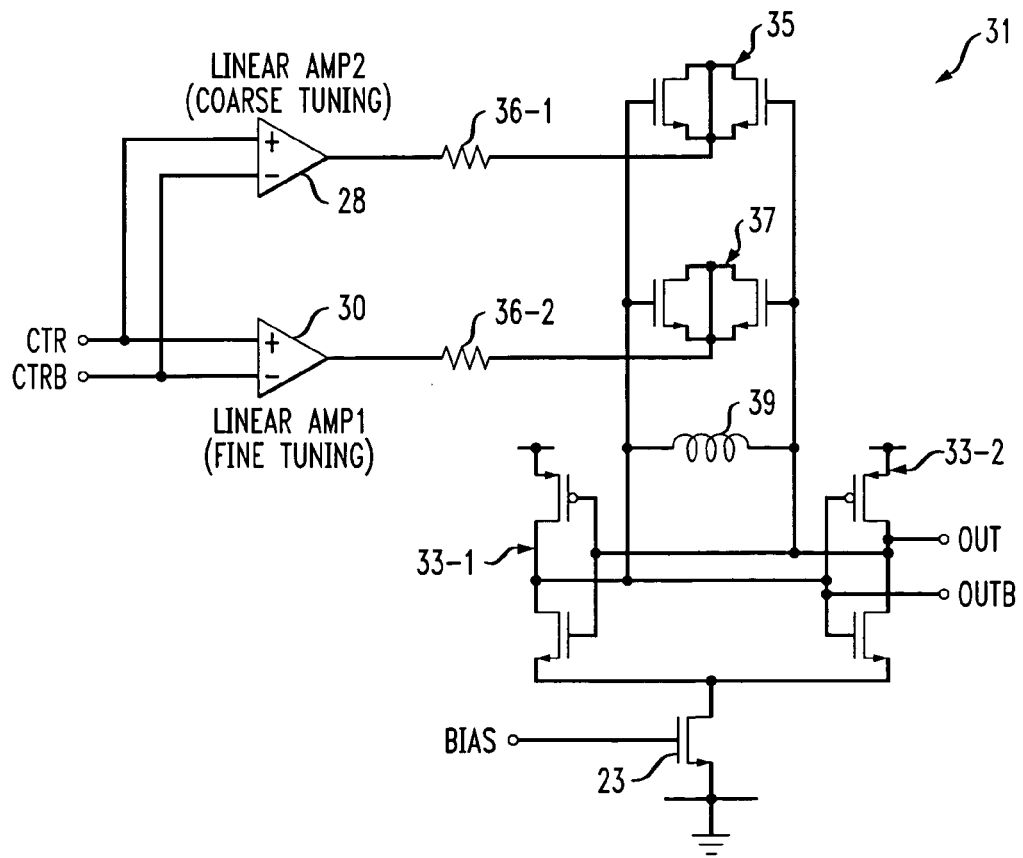
FIG. 4 is a diagram illustrating a single-input dual-path VCO circuit used for a PLL in accordance with an illustrative embodiment of the invention.

A circuit implementation of the single-input dual-path VCO 31 is illustrated in FIG. 4. A coarse-tuning path comprising of a high-gain linear amplifier 28 coupled to a single large varactor 35 via resistor 36-1 provides a wide tuning range. By way of example only, "large" here could mean that a capacitance value associated with the coarse-tuning varactor is 20 times or more greater than a capacitance value associated with the fine-tuning varactor, however, principles of the invention are not limited thereto. A fine-tuning path comprising of a low-gain linear amplifier 30 coupled to a fine-tuning varactor 37 via resistor 36-2 minimizes VCO sensitivity. Therefore, a wide tuning range is possible without increasing the VCO gain. In other words, a wide tuning range can be achieved without degrading the phase noise performance. The VCO 32 comprises a pair of cross-coupled CMOS inverters 33-1, 33-2 which generate a negative resistance to resonate with the accumulation-mode varactors 35, 37 and spiral inductor 39. The CMOS inverter ratio may be optimized for minimum phase noise. Also shown in FIG. 4 is a biasing transistor 23.

Figure 5:
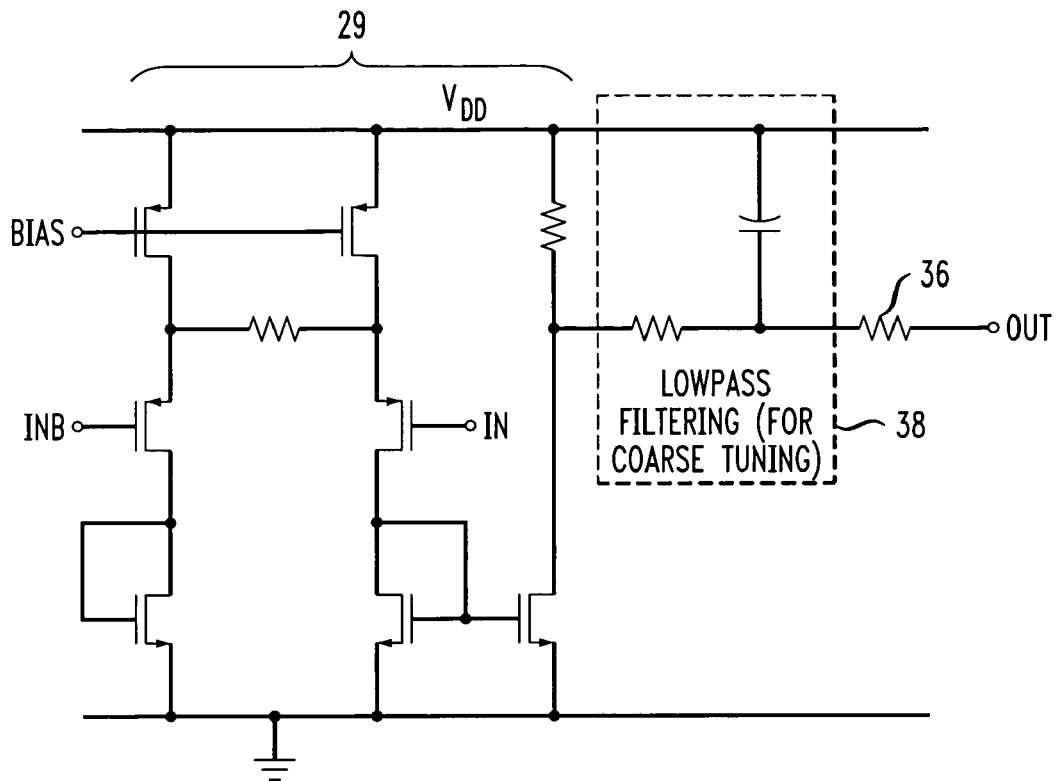
FIG. 5 is a diagram illustrating a linear amplifier circuit used for a PLL in accordance with an illustrative embodiment of the invention.

In FIG. 5, a linear amplifier circuit is depicted in accordance with an illustrative embodiment. Such a linear amplifier may be used to implement each of linear amplifiers 28, 30 of FIG. 3, with a slight difference between them as will be explained below.

A simple differential amplifier with source degeneration (denoted as circuit 29) is used to minimize noise contribution from active devices and to achieve linear gain. The differential input stage is implemented using positive-channel metal oxide semiconductor (PMOS) transistors to reduce flicker noise contribution. A series resistor 36 provides isolation on this control voltage between the VCO switching nodes and the linear amplifier. The linear amplifier 28 in the coarse-tuning loop has higher direct current (dc) gain with much narrower bandwidth. Additional lowpass filtering circuit 38 is thus used at the output of the linear amplifier in the coarse-tuning loop. The bandwidth is sufficiently narrow in order not to disturb PLL loop dynamics. By way of example only, "sufficiently narrow" here could mean narrower than the PLL bandwidth by at least ten times, however, principles of the invention are not limited thereto. The thermal noise contribution from the series resistor will be suppressed by the PLL open-loop gain since the linear amplifier 28 is placed after the loop filter 26. The output of the coarse-tuning linear amplifier 28 is a sensitive single-ended node, and the layout should be done so as to minimize substrate noise coupling.

Figure 6:
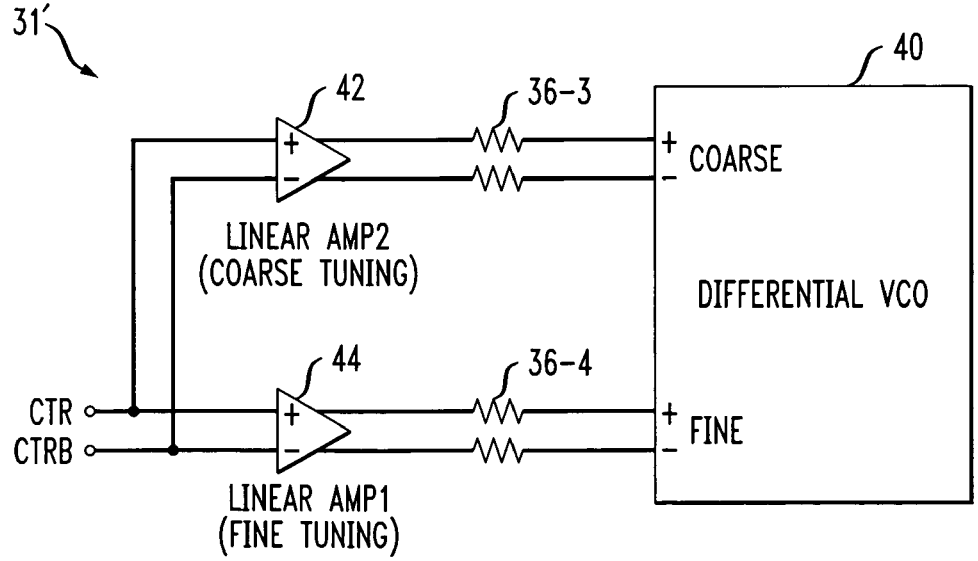
FIG. 6 is a block diagram illustrating a fully differential single-input dual-path LC-VCO in accordance with an illustrative embodiment of the invention.

In FIG. 6, an alternative implementation of a fully differential single-input dual-path VCO (denoted as 31') is depicted. VCO circuit 31' reduces possible noise coupling by having linear amplifiers 42, 44 with differential output and a VCO 40 with differential input, coupled via resistor sets 36-3 and 36-4. By way of one example, a differential input VCO such as is described in J. Kim et al., "44 *GHz Differentially Tuned VCO with* 4 *GHz Tuning Range in* 0.12 *um SOI CMOS*, ISSCC, pp. 416-417, February 2005, the disclosure of which is incorporated by reference, may be employed. The sensitive analog node in the coarse-tuning path can contribute to deterministic jitter (DJ) due to supply and substrate noise coupling. Being fully differential, the output of the linear amplifiers 42, 44 provides common-mode rejection against supply noise as well as substrate noise.

Figure 7:
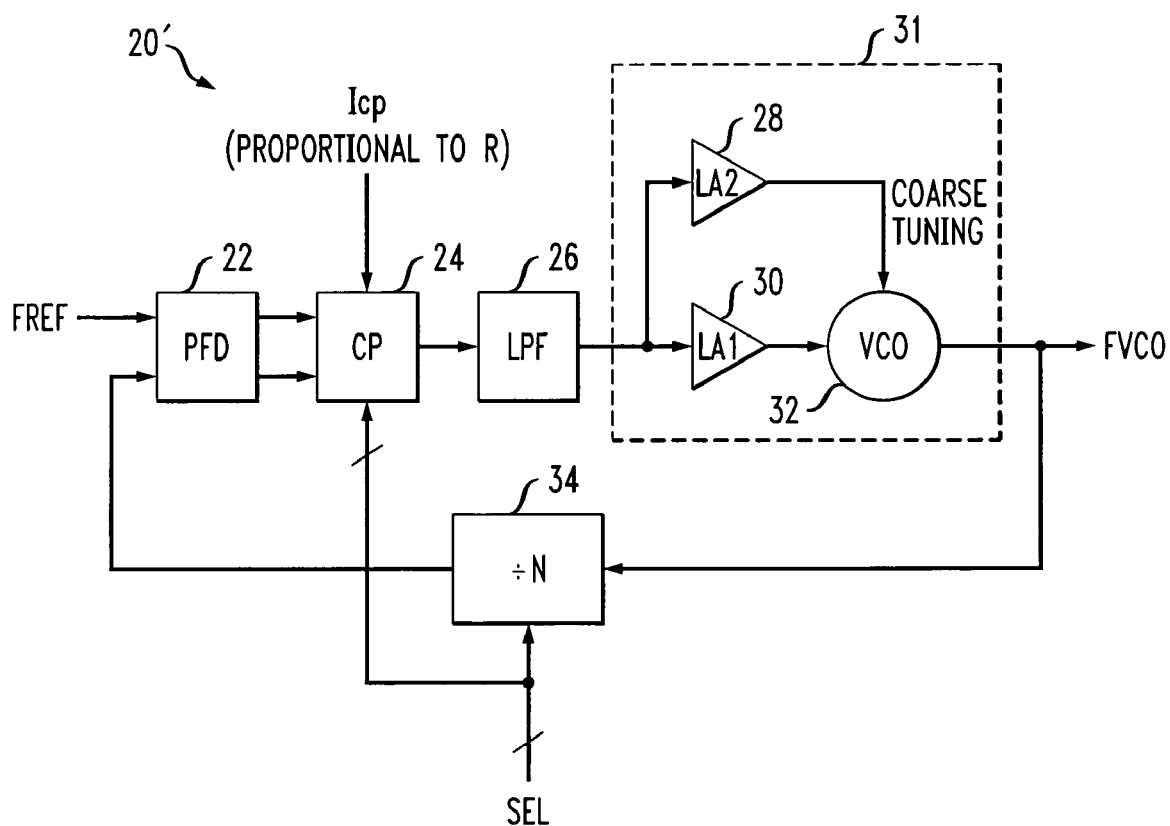
FIG. 7 is a block diagram illustrating an enhanced bandwidth control of the PLL using a programmable charge pump current in accordance with an illustrative embodiment of the invention.

Turning lastly to FIG. 7, an enhanced bandwidth control in PLL 20 is depicted in accordance with an illustrative embodiment. Such an enhanced PPL is denoted as 20'. In this illustrative example, the charge pump 24 has a digitally programmable current output, and the charge pump 24 is controlled in an autonomic or adaptive way such that a different division ratio of the frequency divider 34 sets the appropriate charge pump current value to maintain the constant PLL bandwidth.

In the illustrative embodiment shown, the division ratio N of the frequency divider 34 is digitally selectable via the "SEL" signal. When the PLL 20' has over-damped loop dynamics, the loop bandwidth is proportional to the charge pump current and inversely proportional to the division ratio of the frequency divider 34. Hence, increasing or decreasing the charge pump current corresponding to a respective division ratio increment or decrement will minimize bandwidth variation caused by different division ratio.

Thus, the charge pump current is settable to compensate for different division ratios since the PLL bandwidth corresponds to a ratio of the charge pump current to N. So, when the division ratio N is changed via the SEL signal, the charge pump current is proportionally changed.

One further improvement to reduce the PLL bandwidth variation includes having the charge pump bias current (Icp) inversely proportional to an integrated resistor variation when the loop filter 26 of the PLL 20 is fully integrated on a semiconductor chip. Since the integrated resistor value R varies significantly over temperature and process variation, the resistor variation in the loop filter 26 causes substantial PLL bandwidth variation. Since the phase detector gain in the charge pump PLL is determined by the multiplication product of the charge pump current and the resistor value in the loop filter, having charge pump bias current inversely proportional to resistor variation makes the phase detector gain constant over temperature and process variations. Therefore, fluctuations in loop bandwidth due to temperature and process variations will be minimized.

One way of generating the charge pump current inversely proportional to the integrated resistor variation is to implement the current bias circuit using a quiet reference voltage such as a bandgap reference voltage with an integrated resistor. Being generated by almost constant reference voltage, the bias current has the variation which solely depends on the resistor and such variation is inversely proportional to the resistor variation. Since principles of the invention provide highly linear VCO gain, the embodiment shown in FIG. 7 makes PLL bandwidth less sensitive to temperature and process variations by having constant VCO gain as well as constant phase detector gain, and such bandwidth can be maintained regardless of division ratio of the frequency divider 34 with an autonomic charge pump current control.

Other variations considered to be within the scope of the invention include substitution of equivalent functional circuits for circuit elements, such as the use of current based or controlled circuitry rather than voltage controlled circuitry. Similarly, various types of frequency dividers, phase detectors, charge pumps, and linear amplifiers can be employed.

The invention has been shown and described with respect to particular embodiments. However, it will be understood by those skilled in the art that various changes may be made therein without departing from the spirit and scope of the invention. The scope of the invention is indicated by the appended claims rather than by the foregoing description. All changes which come within the meaning and range of equivalency of the claims are to be embraced within their scope.

What is claimed is:

1. A voltage controlled oscillator circuit, comprising:
   a first linear amplifier, the first linear amplifier generating a coarse-tuning voltage from an input voltage;
   a second linear amplifier, the second linear amplifier generating a fine-tuning voltage from the input voltage; and
   a voltage controlled oscillator comprising a coarse-tuning input coupled to the first linear amplifier, a fine-tuning input coupled to the second linear amplifier, and a clock signal output, wherein a frequency of a signal on the clock signal output is changeable as a function of the input voltage;
   wherein the first linear amplifier comprises a higher gain than the second linear amplifier.

2. A voltage controlled oscillator circuit, comprising:
a first linear amplifier, the first linear amplifier generating a coarse-tuning voltage from an input voltage;
a second linear amplifier, the second linear amplifier generating a fine-tuning voltage from the input voltage; and
a voltage controlled oscillator comprising a coarse-tuning input coupled to the first linear amplifier, a fine-tuning input coupled to the second linear amplifier, and a clock signal output, wherein a frequency of a signal on the clock signal output is changeable as a function of the input voltage;
wherein:
the voltage controlled oscillator comprises a differential-input voltage controlled oscillator comprising a differential coarse-tuning varactor and a differential fine-tuning varactor;
the first linear amplifier comprises a differential output; and
the second liner amplifier comprises a differential output.

3. A phase-locked loop circuit, comprising:
a dual-input voltage controlled oscillator having a coarse tuning input, a fine tuning input, and a clock signal output, wherein signals on the clock signal output have a changing frequency controlled by input signals;
a frequency divider coupled to receive the output of the voltage controlled oscillator and responsive to the output of the voltage controlled oscillator to provide a frequency divided output signal;
a phase and frequency detector that compares a reference clock with an output clock of the frequency divider and generates a charge pump control voltage;
a charge pump coupled to the phase and frequency detector that generates a loop filter control current from the charge pump control voltage;
a loop filter coupled to the charge pump that generates a loop filter voltage from the loop filter control current;
a coarse-tuning linear amplifier coupled to the loop filter that generates a voltage controlled oscillator coarse-tuning voltage from the loop filter voltage; and
a fine-tuning linear amplifier coupled to the loop filter that generates a voltage controlled oscillator fine-tuning voltage from the loop filter voltage;
wherein the coarse-tuning linear amplifier comprises a higher gain than the fine-tuning linear amplifier.

4. A phase-locked loop circuit, comprising:
a dual-input voltage controlled oscillator having a coarse tuning input, a fine tuning input, and a clock signal output, wherein signals on the clock signal output have a changing frequency controlled by input signals;
a frequency divider coupled to receive the output of the voltage controlled oscillator and responsive to the output of the voltage controlled oscillator to provide a frequency divided output signal;
a phase and frequency detector that compares a reference clock with an output clock of the frequency divider and generates a charge pump control voltage;
a charge pump coupled to the phase and frequency detector that generates a loop filter control current from the charge pump control voltage;
a loop filter coupled to the charge pump that generates a loop filter voltage from the loop filter control current;
a coarse-tuning linear amplifier coupled to the loop filter that generates a voltage controlled oscillator coarse-tuning voltage from the loop filter voltage; and
a fine-tuning linear amplifier coupled to the loop filter that generates a voltage controlled oscillator fine-tuning voltage from the loop filter voltage;
wherein:
the dual input voltage controlled oscillator comprises a differential-input voltage controlled oscillator comprising a differential coarse-tuning varactor and a differential fine-tuning varactor;
the coarse-tuning linear amplifier comprises a differential output; and
the fine-tuning linear amplifier comprises a differential output.

5. A phase-locked loop circuit, comprising:
a dual-input voltage controlled oscillator having a coarse tuning input, a fine tuning input, and a clock signal output, wherein signals on the clock signal output have a changing frequency controlled by input signals;
a frequency divider coupled to receive the output of the voltage controlled oscillator and responsive to the output of the voltage controlled oscillator to provide a frequency divided output signal;
a phase and frequency detector that compares a reference clock with an output clock of the frequency divider and generates a charge pump control voltage;
a charge pump coupled to the phase and frequency detector that generates a loop filter control current from the charge pump control voltage;
a loop filter coupled to the charge pump that generates a loop filter voltage from the loop filter control current;
a coarse-tuning linear amplifier coupled to the loop filter that generates a voltage controlled oscillator coarse-tuning voltage from the loop filter voltage;
a fine-tuning linear amplifier coupled to the loop filter that generates a voltage controlled oscillator fine-tuning voltage from the loop filter voltage;
a digitally programmable charge pump current; and
a charge pump current, the variation of which is inversely proportional to a resistor variation in the loop filter.

6. A voltage controlled oscillator circuit, comprising:
a first linear amplifier, the first linear amplifier generating a coarse-tuning voltage from an input voltage;
a second linear amplifier, the second linear amplifier generating a fine-tuning voltage from the input voltage, wherein a gain associated with the first linear amplifier is higher than a gain associated with the second linear amplifier; and
a voltage controlled oscillator comprising a coarse-tuning input coupled to the first linear amplifier, a fine-tuning input coupled to the second linear amplifier, and a clock signal output, wherein a frequency of a signal on the clock signal output is changeable as a function of the input voltage.

7. A voltage controlled oscillator circuit, comprising:
a first linear amplifier, the first linear amplifier generating a coarse-tuning voltage from an input voltage;
a second linear amplifier, the second linear amplifier generating a fine-tuning voltage from the input voltage; and
a voltage controlled oscillator comprising:
a coarse-tuning input coupled to the first linear amplifier;
a fine-tuning input coupled to the second linear amplifier;
a clock signal output, wherein a frequency of a signal on the clock signal output is changeable as a function of the input voltage;
a coarse-tuning varactor coupled to the coarse-tuning input; and
a fine-tuning varactor coupled to the fine-tuning input;
wherein a capacitance value associated with the coarse-tuning varactor is larger than a capacitance value associated with the fine-tuning varactor.

* * * * *